United States Patent [19]

McElroy

[11] Patent Number: 4,634,901
[45] Date of Patent: Jan. 6, 1987

[54] SENSE AMPLIFIER FOR CMOS SEMICONDUCTOR MEMORY DEVICES HAVING SYMMETRICALLY BALANCED LAYOUT

[75] Inventor: David J. McElroy, Houston, Tex.

[73] Assignee: Texas Instruments Incorporated, Dallas, Tex.

[21] Appl. No.: 636,937

[22] Filed: Aug. 2, 1984

[51] Int. Cl.[4] .......................................... H03K 17/687
[52] U.S. Cl. ........................................ 307/530; 307/443;
307/451; 307/579; 307/303
[58] Field of Search ............... 307/443, 448, 451–452,
307/530, 572, 579, 585, 279, 291, 303; 357/42,
45; 365/202, 205

[56] References Cited

U.S. PATENT DOCUMENTS

| 4,003,035 | 1/1977 | Hoffman et al. | 307/530 X |
| 4,139,911 | 2/1979 | Sciulli et al. | 307/530 X |
| 4,286,178 | 8/1981 | Rao et al. | 365/205 X |
| 4,479,202 | 10/1984 | Uchida | 365/205 X |
| 4,506,349 | 3/1985 | Mazin et al. | 357/42 X |
| 4,545,037 | 10/1985 | Nakano et al. | 307/530 X |

Primary Examiner—Stanley D. Miller
Assistant Examiner—D. R. Hudspeth
Attorney, Agent, or Firm—John G. Graham

[57] ABSTRACT

A sense amplifier circuit for a CMOS DRAM or the like uses cross-coupled P-channel load transistors and cross-coupled N-channel driver transistors. Both of the P-channel transistors are in an N-well in the center of a symmetrical layout on the chip. Each N-channel transistor is split into two separate transistors, one on each side of the N-well, so that a balanced configuration is possible.

14 Claims, 3 Drawing Figures

SENSE AMPLIFIER FOR CMOS SEMICONDUCTOR MEMORY DEVICES HAVING SYMMETRICALLY BALANCED LAYOUT

BACKGROUND OF THE INVENTION

This invention relates to semiconductor devices, and more particularly to sense amplifier circuits of the type used in CMOS semiconductor memory devices.

Semiconductor dynamic read/write memory devices such as the 16K DRAM of U.S. Pat. No. 4,071,801, or the 64K DRAM of U.S. Pat. No. 4,239,993, have been manufactured using NMOS processing as set forth in U.S. Pat. Nos. 4,055,444 and 4,242,092, for example; said patents being assigned to Texas Instruments. It is preferable to employ CMOS processing, however, when low power dissipation is a primary objective. The sense amplifiers consume a significant part of the total power in a dynamic RAM, and so it is preferable that the sense amplifier chosen is a CMOS circuit. Previous CMOS sense amplifiers have been either two large or have been unbalanced when laid out for manufacture in a semiconductor bar. The sense amplifier must lay out in such a manner that it fits within the pitch of bit lines of the cell array, placing one constraint upon the design. Of course, the components should be electrically and physically balanced to avoid introducing differential voltage or capacitance at the sense nodes.

It is the principal object of this invention to provide improved sense amplifier circuits for semiconductor memory devices, particularly devices made by CMOS processing. Another object is to provide improved sense amplifier circuits which can be constructed in CMOS technology in a balanced configuration.

SUMMARY OF THE INVENTION

In accordance with one embodiment of the invention, a sense amplifier circuit for a CMOS DRAM or the like uses cross-coupled P-channel load transistors and cross-coupled N-channel driver transistors. Both of the P-channel transistors are in an N-well in the center of a symmetrical layout on the chip. Each N-channel transistor is split into two separate transistors, one on each side of the N-well, so that a balanced configuration is possible.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
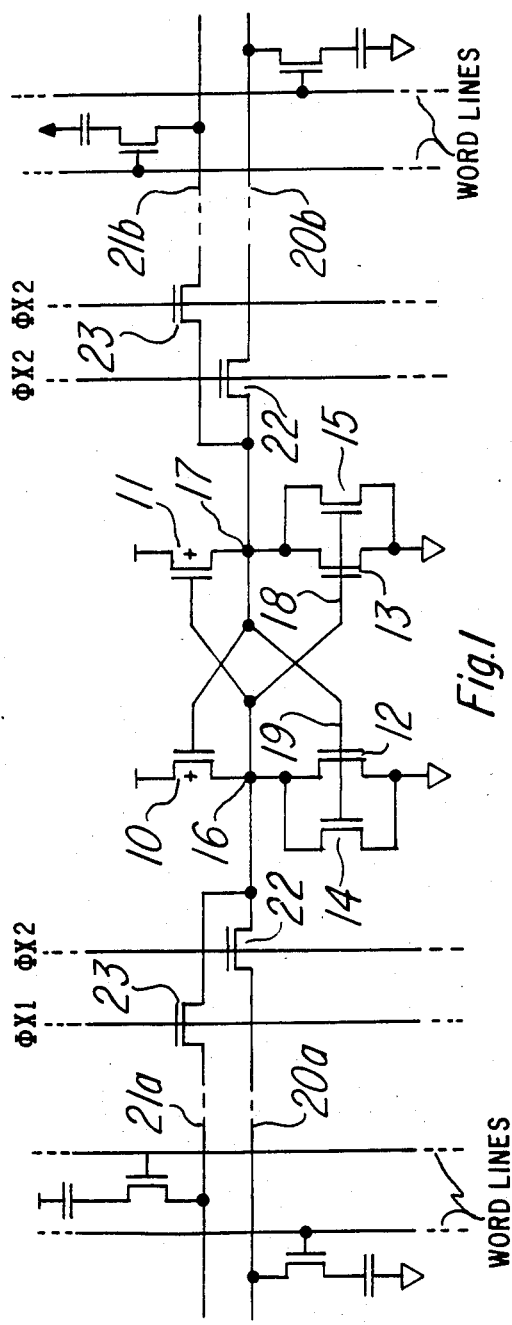
FIG. 1 is an electrical schematic diagram of a sense amplifier circuit for a memory device according to the invention.

Referring to FIG. 1, a CMOS sense amplifier for dynamic memory circuits according to the invention is illustrated in schematic form. This circuit includes two P-channel load transistors 10 and 11, and two N-channel driver transistors 12 and 13, with two additional N-channel driver transistors 14 and 15 in parallel with the N-channel driver transistors 12 and 13. The sense nodes 16 and 17 are cross-coupled to the gates 18 and 19 of the N-channel transistors on opposite sides, and are also coupled to the bit lines; the sense amplifier circuit is multiplexed to two sets of bit line halves 20a and 20b or 21a and 21b through transistors 22 or 23 which have $\phi X1$ and $\phi X2$ on their gates. These bit lines 20a, 20b or 21a, 21b each have, for example, 128 or 64 one-transistor cells 24 connected to them as in above-mentioned U.S. Pat. Nos. 4,071,801, or 4,239,993; row lines 25 select the particular cell to be connected to the bit lines.

Figure 2:
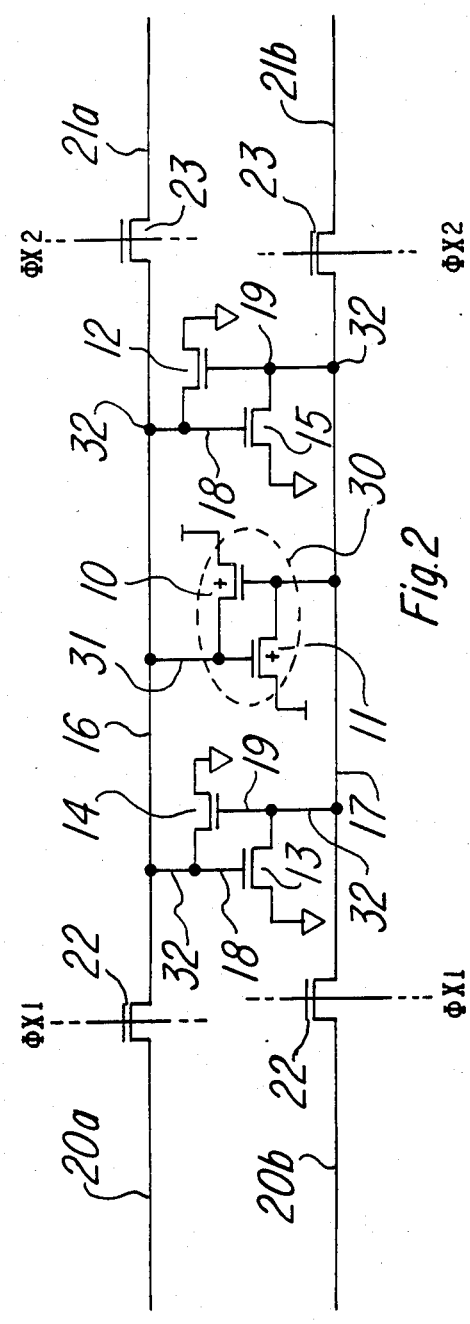
FIG. 2 is an electrical schematic diagram of the circuit of FIG. 1 but laid out as on a semiconductor chip.

As seen in FIG. 2, the sense amplifier circuit is laid out with the P-channel transistors 10 and 11 in a central location so that an N-well 30 in the face of the chip can contain both P-channel transistors. The four N-channel transistors 12,13,14 and 15 are laid out in a balanced manner on both sides of the central N-well 30. The sense amplifier is therefore symmetrical and no differentials caused by unbalance are introduced. In FIG. 2 the bit lines 20a and 20b are both on the left and bit lines 21a and 21b are both on the right, so the halves of a column are "folded" to be mechanically on the same side of a sense amplifier.

Figure 3:
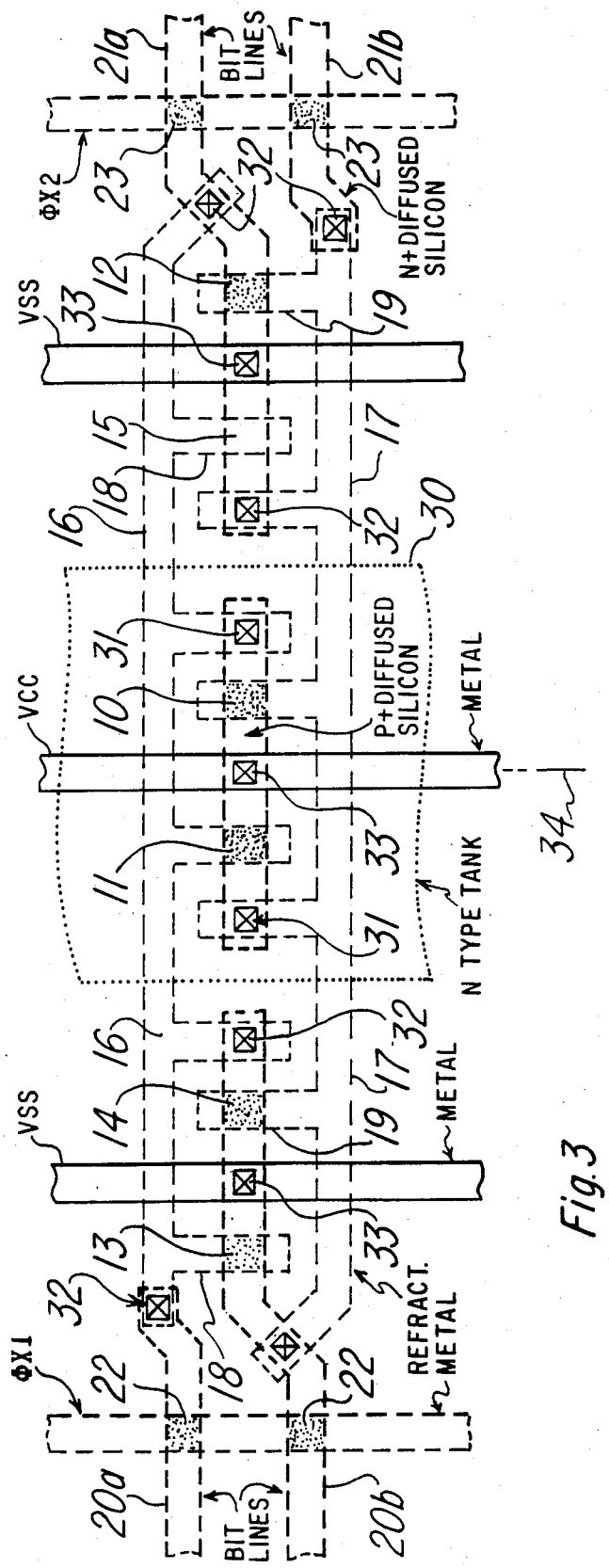
FIG. 3 is a plan view of a small part of a semiconductor chip containing the circuit of FIGS. 1 and 2.

The circuit of FIG. 2 is shown in FIG. 3 in the form of a layout on a semiconductor integrated circuit. FIG. 3 is a plan view, greatly enlarged, of a very small part of a dynamic RAM device, showing one sense amplifier in a long narrow area fitting in the pitch of the bit lines of the array. A 1-Megabit dynamic RAM, such as that shown in my U.S. patent application Ser. No. 634,898, filed July 26, 1984, assigned to Texas Instruments, which are incorporated herein by reference, employ 2048 sense amplifiers for an array of 20 or 1,048,576 one-transistor cells. In the layout of FIG. 3, the P-channel transistors 10 and 11 are in a central N type well or tank 30 in a P-type substrate formed as in U.S. Pat. No. 4,295,897, assigned to Texas Instruments, for example. This tank 30 can be common to all sense amplifiers in a large block of cells of the array. The sense nodes 16 and 17 are parallel strips of low-resistance first or second level interconnect, such as polysilicon clad with silicide, or preferably a refractory metal such as molybdenum; this conductor strip also forms the gates of transistors 10,11,12,13,14 and 15 (as at projections 18 and 19), and makes contact to the P+ diffused silicon moat regions at contact areas 31, or N+ diffused silicon moat regions at contact areas 32. The connections to the supply voltage Vcc and the ground Vss are top-level metal strips, such as aluminum, overlying the strips 16 and 17 but insulated therefrom; contacts from these metal strips to the N+ diffused silicon are made at contact areas 33. Instead of being directly connected to ground, these Vcc and Vss lines may be coupled to P and N channel transistors as disclosed in my application Ser. No. 634,898, or in application Ser. Nos. 636,938, 636,939, and 636,940, filed Aug. 2, 1984 by Charvaka Duvvury and Adin Hyslop, assigned to Texas Instruments. The sense amplifier circuit of FIGS. 1-3 is thus constructed to be mirror-image symmetrical about a center-line 34 of FIG. 3, so the sensing operation is balanced, and there is less likelihood of differences in threshold voltages, etc., due to process variations, thermal gradients, injected carriers (as from alpha particles), etc.

While this invention has been described with reference to an illustrative embodiment, this description is not intended to be construed in a limiting sense. Various modifications of the illustrative embodiment, as well as other embodiments of the invention, will be apparent to persons skilled in the in the art upon reference to this description. It is therefore contemplated that the appended claims will cover any such modifications or embodiments as fall within the true scope of the invention.

What is claimed:

1. A CMOS sense amplifier circuit for a semiconductor memory device formed in a face of a semiconductor body, comprising:

a pair of P-channel transistors, and first and second pairs of N-channel transistors, each of said transistors having a source-to-drain path and a gate, means connecting the source-to-drain paths of the P-channel transistors separately between a pair of sense nodes and voltage supply means, said sense nodes being separately coupled to bit lines, means connecting the source-to-drain paths of the first pair of N-channel transistors separately between said pair of sense nodes and grounding means, means connecting the source-to-drain paths of said second pair of N-channel transistors separately in parallel with the source-to-drain paths of said first pair of N-channel transistors, means cross-coupling the gate of each one of the P-channel transistors to said sense node to which the other one of the P-channel transistors is connected, and means cross-coupling the gates of each one of the first and second pair of N-channel transistors to said sense node to which the other one of said first and second pair is connected.

2. A circuit according to claim 1 wherein said pair of P-channel transistors is formed in said face within an N-well.

3. A circuit according to claim 2 wherein the transistors of said first pair of N-channel transistors are positioned on said face on opposite sides of said N-well.

4. A circuit according to claim 3 wherein the transistors of said second pair of N-channel transistors are positioned on said face on opposite sides of said N-well.

5. A circuit according to claim 4 wherein said sense nodes are elongated conductors extending along both sides of said N-well.

6. A circuit according to claim 5 wherein said elongated conductors are selectively connected to pairs of bit lines extending outwardly of said sense amplifier on said face on both sides of said N-well.

7. A CMOS cross-coupled latch circuit formed in a face of a semiconductor body, comprising:

first and second transistors of one type of channel conductivity positioned symmetrically about a centerline in a first part of an area of said face of the semiconductor body;

third and fourth transistors of the opposite type of channel conductivity positioned symmetrically about said centerline in second and third parts of said area of said face, said first part being between said second and third parts, said circuit having first and second nodes, each of said transistors having a source-to-drain path and a gate, and means connecting the source-to-drain path of each of said transistors to at least one of said nodes;

wherein said area has a length greater than its width and said centerline bisects said area perpendicular to said length.

8. A circuit according to claim 7 wherein said third and fourth transistors are each split into a pair of physically separate transistors in said second and third parts of said area, each one of said pairs having said separate transistors on opposite sides of said centerline.

9. A circuit according to claim 8 wherein said first and second transistors are P-channel and said third and fourth transistors are N-channel.

10. A circuit according to claim 9 wherein both said first and second transistors are formed in an N tank in a P type substrate, said N tank being in said first part of said area.

11. A CMOS circuit arranged on a face of a semiconductor body to achieve physical symmetry and electrical balance, comprising:

a pair of P-channel transistors of equal size positioned in an N-well area of said face, a first pair of N-channel transistors, one of said first pair positioned in an area on one side of said N-well area of said face, and the other of said first pair positioned in an area on said face on the opposite side of said N-well area, a second pair of N-channel transistors, one of said second pair positioned in said area on one side of said N-well area, and the other of said second pair positioned in said area on the opposite side, said circuit including at least first and second nodes, each of said transistors having a source-to-drain path, and means connecting the source-to-drain paths of each said transistors to at least one of said nodes.

12. A circuit according to claim 11 wherein said area on one side and said area on the opposite side are symmetrical about a centerline extending through said N-well area.

13. A circuit according to claim 12 wherein said first and second nodes include elongated conductive paths extending along said face through said N-well area and through said area on one side and said area on the opposite side.

14. A circuit according to claim 13 wherein said one of said first pair of transistors has a gate connected in common with a gate of said one of said second pair.

* * * * *